US012356603B2

(12) United States Patent
You

(10) Patent No.: US 12,356,603 B2
(45) Date of Patent: Jul. 8, 2025

(54) SEMICONDUCTOR STRUCTURE AND MANUFACTURING METHOD FOR SAME

(71) Applicant: Changxin Memory Technologies, Inc., Anhui (CN)

(72) Inventor: Kang You, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 476 days.

(21) Appl. No.: 17/954,316

(22) Filed: Sep. 27, 2022

(65) Prior Publication Data
US 2023/0422478 A1    Dec. 28, 2023

Related U.S. Application Data

(63) Continuation of application No. PCT/CN2022/107125, filed on Jul. 21, 2022.

(30) Foreign Application Priority Data

Jun. 22, 2022    (CN) .......................... 202210716305.7

(51) Int. Cl.
*H10B 12/00*    (2023.01)
(52) U.S. Cl.
CPC ............. *H10B 12/03* (2023.02); *H10B 12/05* (2023.02); *H10B 12/30* (2023.02); *H10B 12/488* (2023.02)
(58) Field of Classification Search
CPC ...................................... H10B 12/00
See application file for complete search history.

(56) References Cited

U.S. PATENT DOCUMENTS

| 9,978,752 B2 | 5/2018 | Kim et al. |
| 2011/0204420 A1 | 8/2011 | Kim et al. |

(Continued)

FOREIGN PATENT DOCUMENTS

| CN | 110520989 A | 11/2019 |
| CN | 113745224 A | 12/2021 |

(Continued)

OTHER PUBLICATIONS

PCT International Search Report and the Written Opinion mailed Dec. 19, 2022, issued in related International Application No. PCT/CN2022/107125, with English translation (16 pages).

(Continued)

*Primary Examiner* — Zandra V Smith
*Assistant Examiner* — Molly K Reida
(74) *Attorney, Agent, or Firm* — Sheppard Mullin Richter & Hampton LLP

(57) ABSTRACT

A semiconductor structure includes: a transistor structure and a capacitor structure that are arranged along a first direction, where the capacitor structure extends along the first direction; and a wordline staircase structure extending along the first direction, where the wordline staircase structure and the transistor structure are disposed along a second direction intersecting with the first direction. A plane perpendicular to the second direction is used as a reference plane. An orthographic projection of the transistor structure on the reference plane is a first projection. An orthographic projection of the capacitor structure on the reference plane is a second projection. An orthographic projection of the wordline staircase structure on the reference plane is a third projection. The third projection covers the first projection, and the third projection partially overlaps the second projection.

19 Claims, 9 Drawing Sheets

(56) References Cited

U.S. PATENT DOCUMENTS

| | | |
|---|---|---|
| 2012/0012913 A1 | 1/2012 | Lee |
| 2018/0323199 A1 | 11/2018 | Roberts et al. |
| 2021/0159229 A1 | 5/2021 | Gomes et al. |
| 2021/0375875 A1* | 12/2021 | Brewer .............. H10D 30/6757 |
| 2022/0262425 A1 | 8/2022 | Kim et al. |
| 2023/0171947 A1 | 6/2023 | You et al. |

FOREIGN PATENT DOCUMENTS

| | | |
|---|---|---|
| CN | 114023703 A | 2/2022 |
| CN | 114141711 A | 3/2022 |
| CN | 114530419 A | 5/2022 |
| TW | 202103303 A | 1/2021 |

OTHER PUBLICATIONS

Extended European Search Report dated Oct. 29, 2024, issued in related European Patent Application No. 22941871.0 (11 pages).

Search Report dated Nov. 23, 2023, issued in related Taiwan Application No. 112122250, with English translation (2 pages).

\* cited by examiner

SEMICONDUCTOR STRUCTURE AND MANUFACTURING METHOD FOR SAME

CROSS-REFERENCE TO RELATED APPLICATIONS

This application is a continuation application of International Patent Application No. PCT/CN2022/107125, filed on Jul. 21, 2022, which claims priority to Chinese Patent Application No. 202210716305.7, filed with the China National Intellectual Property Administration on Jun. 22, 2022 and entitled "SEMICONDUCTOR STRUCTURE AND MANUFACTURING METHOD FOR SAME." The above-referenced applications are incorporated herein by reference in their entirety.

TECHNICAL FIELD

Embodiments of this disclosure relate to the field of semiconductor technologies, and in particular, to a semiconductor structure and a manufacturing method for the same.

BACKGROUND

With relentless development of semiconductor structures, the feature size of the semiconductor structures constantly decreases. However, limited by lithography machines, the decrease of the feature size of the semiconductor structure is constrained. Therefore, making a chip with higher storage density on a wafer is the research goal for many in the field. In a two-dimensional or planar semiconductor device, storage units are all arranged in a horizontal direction. Therefore, the packing density of the two-dimensional or planar semiconductor devices may depend on an area occupied by a single storage unit, and the packing density of the two-dimensional or planar semiconductor device is greatly affected by technologies used to form fine patterns. Consequently, the packing density of the two-dimensional or planar semiconductor device is limited. Therefore, the development of semiconductor devices is moving towards three-dimensional semiconductor devices.

However, the locations of various functional components in an existing three-dimensional semiconductor device need to be redesigned. For example, existing layout space needs to be fully used while ensuring various functional components are not mutually affected, so as to improve the packing density of the three-dimensional semiconductor device in a wafer.

SUMMARY

Embodiments of this disclosure provide a semiconductor structure and a manufacturing method for the same that at least improve the packing density of a transistor structure and a capacitor structure in the semiconductor structure.

One aspect of the embodiments of this disclosure provides a semiconductor structure, including: a transistor structure and a capacitor structure that are arranged along a first direction, where the capacitor structure extends along the first direction; a wordline staircase structure, where the wordline staircase structure and the transistor structure are disposed along a second direction, the wordline staircase structure extends along the first direction, the first direction intersects the second direction, and the wordline staircase structure is electrically connected to the transistor structure, where a plane perpendicular to the second direction is used as a reference plane, an orthographic projection of the transistor structure on the reference plane is a first projection, an orthographic projection of the capacitor structure on the reference plane is a second projection, an orthographic projection of the wordline staircase structure on the reference plane is a third projection, the third projection covers the first projection, and the third projection partially overlaps the second projection.

According to some embodiments of this disclosure, another aspect of the embodiments of this disclosure further provides a manufacturing method for a semiconductor structure, including: forming a transistor structure and a capacitor structure that are arranged along a first direction, where the capacitor structure extends along the first direction; and forming a wordline staircase structure, where the wordline staircase structure and the transistor structure are disposed along a second direction, the wordline staircase structure extends along the first direction, the first direction intersects the second direction, and the wordline staircase structure is electrically connected to the transistor structure, where a plane perpendicular to the second direction is used as a reference plane, an orthographic projection of the transistor structure on the reference plane is a first projection, an orthographic projection of the capacitor structure on the reference plane is a second projection, an orthographic projection of the wordline staircase structure on the reference plane is a third projection, the third projection covers the first projection, and the third projection partially overlaps the second projection.

BRIEF DESCRIPTION OF DRAWINGS

One or more embodiments are exemplified by the corresponding accompanying drawings, and these exemplifications do not constitute limitations on the embodiments. Similar elements are denoted with the same reference numerals in the accompanying drawings. Unless otherwise stated, the accompanying drawings do not conform to scale. To describe technical solutions of embodiments of this disclosure or conventional technologies more clearly, the following briefly describes the accompanying drawings to be used in the embodiments. Apparently, the accompanying drawings in the following description show merely some embodiments of this disclosure, and a person of ordinary skill in the art may still derive other drawings from these accompanying drawings without creative efforts.

DESCRIPTION OF EMBODIMENTS

Embodiments of this disclosure provide a semiconductor structure and a manufacturing method for the same. In the semiconductor structure, a transistor structure is neighboring to a capacitor structure along a first direction, and a transistor structure is neighboring to a wordline staircase structure along a second direction. In this way, the total structural length of the transistor structure, the capacitor structure, and the wordline staircase structure in the first direction is reduced while the transistor structure is electrically connected to the wordline staircase structure. In addition, it can be understood that the structural length of the semiconductor structure in the first direction usually depends on the structural length of the capacitor structure in the first direction. A portion of the wordline staircase structure extending along the first direction faces the capacitor structure, so that the wordline staircase structure can be arranged along the first direction to the extent possible while the structural length of the wordline staircase structure in the second direction is reduced. These structures can increase the length of the facing area between the wordline staircase structure and the capacitor structure, effectively use the layout space, and reduce the total layout area of the semiconductor structure. Therefore, the packing density of the transistor structure and the capacitor structure in the semiconductor structure is improved.

The following describes in detail the embodiments of this disclosure with reference to the accompanying drawings. However, a person of ordinary skill in the art can understand that in the embodiments of this disclosure, to help the readers better understand the embodiments of this disclosure, many technical details are provided. However, the technical solutions claimed in the embodiments of this disclosure can also be implemented even without these technical details and various changes and modifications made based on the following embodiments.

Figure 1:
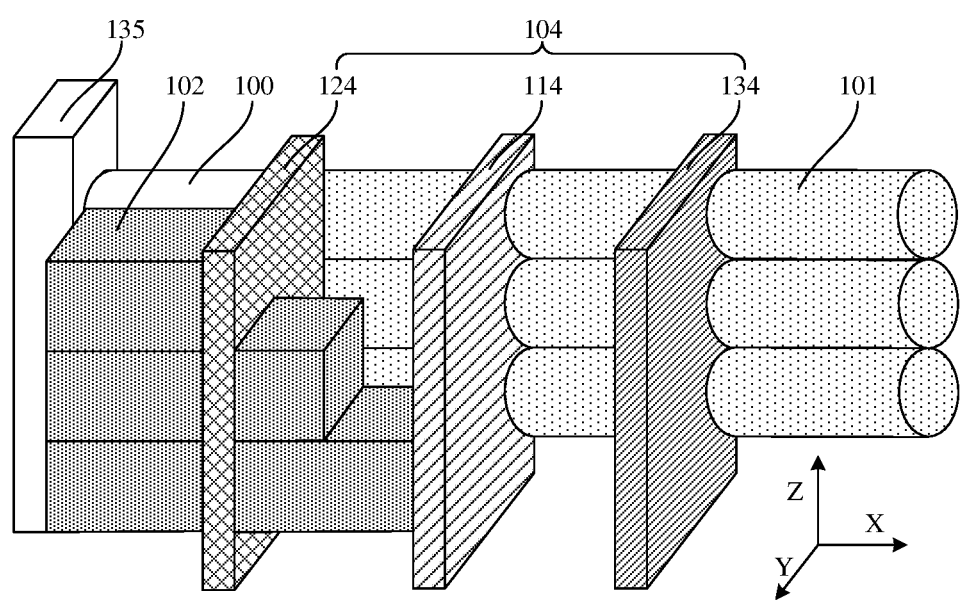
FIG. 1 is a schematic diagram of a portion of three-dimensional structure of a semiconductor structure according to an embodiment of this disclosure.
Figure 2:
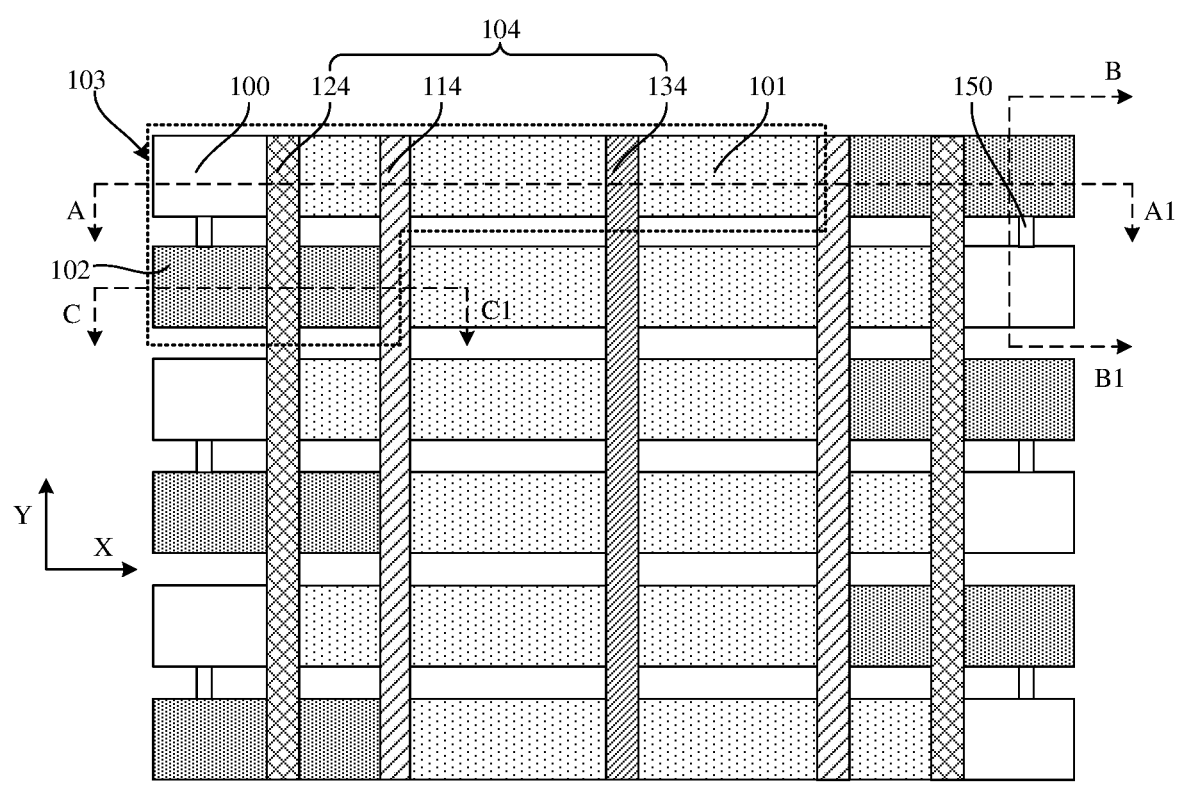
FIG. 2 is a partial top view of a semiconductor structure according to an embodiment of this disclosure.
Figure 3:
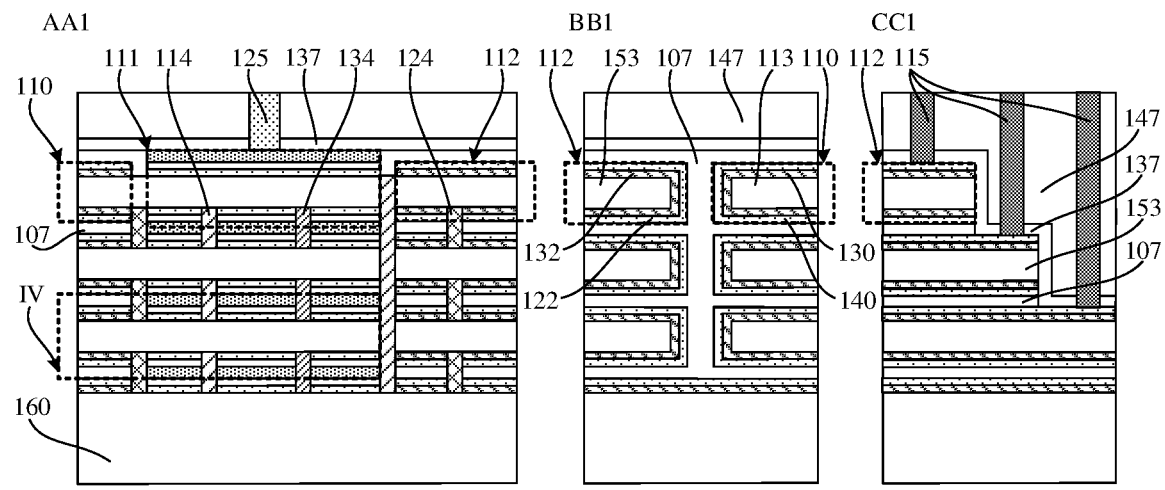
FIG. 3 is a schematic cross-sectional view of the semiconductor structure shown in FIG. 1 taken along the line AA1, the line BB1, and the line CC1.
Figure 4:
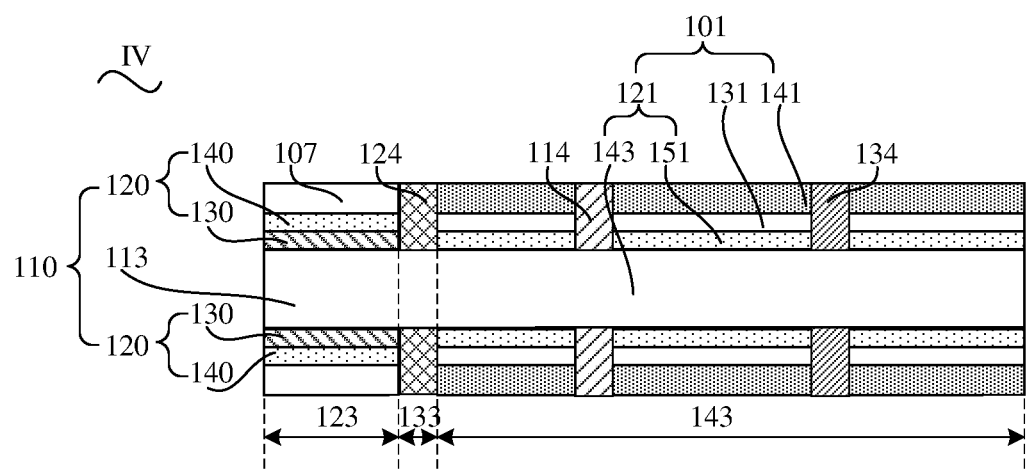
FIG. 4 is a schematic enlarged view of the region IV shown in FIG. 3.

An embodiment of this disclosure provides a manufacturing method for a semiconductor structure. The manufacturing method for a semiconductor structure provided in an embodiment of this disclosure will be described in detail below with reference to the accompanying drawings. FIG. 1 is a schematic diagram of a portion of three-dimensional structure of a semiconductor structure according to an embodiment of this disclosure; FIG. 2 is a partial top view of a semiconductor structure according to an embodiment of this disclosure; FIG. 3 is a schematic sectional view of the semiconductor structure shown in FIG. 1 taken along the line AA1, the line BB1, and the line CC1; and FIG. 4 is a schematic enlarged structural view of the region IV shown in FIG. 3.

As shown in FIG. 1, the semiconductor structure includes: a transistor structure 100 and a capacitor structure 101 that are arranged along a first direction X, where the capacitor structure 101 extends along the first direction X; and a wordline staircase structure 102, where the wordline staircase structure 102 and the transistor structure 100 are disposed along a second direction Y, the wordline staircase structure 102 extends along the first direction X, the first direction X intersects the second direction Y, and the wordline staircase structure 102 is electrically connected to the transistor structure 100, where a plane perpendicular to the second direction Y is used as a reference plane, an orthographic projection of the transistor structure 100 on the reference plane is a first projection, an orthographic projection of the capacitor structure 101 on the reference plane is a second projection, an orthographic projection of the wordline staircase structure 102 on the reference plane is a third projection, the third projection covers the entire first projection, and the third projection partially, but not entirely, overlaps the second projection.

It can be understood that, as shown in FIG. 1, the transistor structure 100 and the capacitor structure 101 are arranged along the first direction X, the transistor structure 100 and the wordline staircase structure 102 are arranged along the second direction Y, and both the wordline staircase structure 102 and the capacitor structure 101 extend along the first direction X. Generally, as requirements on the capacitor structure 101 with a large electric capacity increase, the capacitor structure 101 occupies a relatively long structural length in the first direction X. Therefore, the structural length of the semiconductor structure in the first direction X usually depends on the structural length of the capacitor structure 101 in the first direction X. Therefore, the arrangement for the transistor structure 100, the capacitor structure 101, and the wordline staircase structure 102 in this manner increases the transition region between the wordline staircase structure 102 and the capacitor structure 101, that is, increases an overlapped area between the third projection and the second projection. In this way, the wordline staircase structure 102 can be extended along the first direction X as long as possible while the structural length of the wordline staircase structure 102 in the second direction Y is reduced, so that the structural length of the semiconductor structure in the second direction Y is reduced by reducing the structural length of the wordline staircase structure 102 in the second direction Y, while the structural length of the semiconductor structure in the first direction X is not increased, thereby effectively using the layout space and reducing the total layout area of the semiconductor structure. In this way, more transistor structures 100, capacitor structures 101, and wordline staircase structures 102 can be integrated in a same layout area, thereby improving the packing density of the semiconductor structure.

The following describes the semiconductor structure in detail with reference to FIG. 1 to FIG. 4.

In some embodiments, as shown in FIG. 2, the transistor structure 100, the capacitor structure 101, and the wordline staircase structure 102 form a storage structure 103, two neighboring storage structures 103 along the first direction X are centrosymmetric, and a wordline staircase structure 102 in one of the two storage structures 103 and a capacitor structure 101 in the other storage structure are disposed along the first direction X.

It can be understood that, for a single storage structure 103, the wordline staircase structure 102 is protruded relative to the transistor structure 100 and the capacitor structure 101 in the second direction Y. In addition, due to the requirement to increase the electric capacity of the capacitor structure 101, the structural length of the capacitor structure 101 is greater than the structural length of the wordline staircase structure 102 in the first direction X, so that in the extension direction of the wordline staircase structure 102, a portion of region facing the capacitor structure 101 is vacant. The wordline staircase structure 102 may merely have a step structure in the first direction X, or may have step structures in both the first direction X and the second direction Y, thereby increasing the quantity of step structures within a same area. In an embodiment of this disclosure, two neighboring storage structure 103 in the first direction X are centrosymmetric, and the vacant region of one of the two storage structures 103 may correspond to the vacant region of the other storage structure 103, that is, the capacitor structure 101 in one of the storage structures 103 may be deployed in the vacant region, which does not face the wordline staircase structure 102, of the other storage structure 103, to improve the layout density of the storage structure 103.

In addition, the wordline staircase structure 102 in one of the two storage structures 103 and the capacitor structure 101 in the other storage structure 103 are disposed along the first direction X. In this way, the structural length of two storage structures 103 in the second direction Y is the same as that of one storage structure 103 in the second direction Y, that is, the wordline staircase structure 102 in one of the two storage structures 103 is disposed in parallel to the capacitor structure 101 in the other storage structure 103. This further improves the layout density of the storage structure 103, thereby improving the packing density of the semiconductor structure.

There is a first gap between the wordline staircase structure 102 in one of the two storage structures 103 and the capacitor structure 101 in the other storage structure 103. When the structural length of the first gap in the first direction X is not considered, the structural length of the two storage structures 103 in the first direction X is equivalent to a sum of the structural length of one storage structure 103 in the first direction X and the structural length of one wordline staircase structure 102 in the first direction X. In this way, the structural length of two storage structures 103 in the first direction X can be reduced to further improve the layout density of the storage structure 103.

It should be noted that FIG. 2 is illustrated by using an example in which there are two storage structures 103 disposed in the first direction X, there are three storage structures 103 disposed in the second direction Y, and there are a total of six storage structures 103. In actual application, the quantity of storage structures 103 disposed in the first direction X and the quantity of storage structures 103 disposed in the second direction Y are not limited, provided that two neighboring storage structures 103 in the direction X are centrosymmetric.

In some embodiments, as shown in FIG. 3 and FIG. 4, the semiconductor structure may further include a substrate 160, which is located exactly below the transistor structure 100, the capacitor structure 101, and the wordline staircase structure 102 in a third direction Z, and is used as a support base of the transistor structure 100, the capacitor structure 101, and the wordline staircase structure 102.

In some embodiments, as shown in FIG. 1, FIG. 3, and FIG. 4, the transistor structure 100 may include a plurality of sub transistor structures 110 disposed along the third direction Z. The third direction Z, the second direction Y, and the first direction X intersect each other. The capacitor structure 101 includes a plurality of sub capacitor structures 111 arranged along the third direction Z, and the sub capacitor structure 111 includes a bottom electrode layer 121, a capacitor dielectric layer 131, and a top electrode layer 141 that are sequentially stacked. The wordline staircase structure 102 includes a plurality of step structures 112 disposed along the third direction Z, the step structure 112 extends along the first direction X, and the lengths of the plurality of step structures 112 in the first direction X are different. The sub transistor structures 110 are connected to the sub capacitor structures 111 in a one-to-one correspondence, and the sub transistor structures 110 are connected to the step structures 112 in a one-to-one correspondence.

It can be understood that along the third direction Z, a plurality of sub transistor structures 110 and a plurality of sub capacitor structures 111 may be arranged, one sub transistor structure 110 may be used as an individual transistor unit, one sub capacitor structure 111 may be used as an individual capacitor unit, and one transistor unit and capacitor unit may form a storage unit. In this way, by stacking the sub transistor structures 110 and the sub capacitor structures 111 in the third direction Z, the layout density of the storage units in the semiconductor structure is improved, thereby improving the packing density of the semiconductor structure.

In addition, the sub transistor structures 110 are connected to the step structures 112 in a one-to-one correspondence, and the lengths of the plurality of step structures 112 in the first direction X are different. Therefore, different sub transistor structures 110 can be controlled by using different step structures 112, so that different sub transistor structures 110 are independent of each other. In some embodiments, in the direction from the sub transistor structure 110 to the substrate 160, the lengths of the plurality of step structures 112 in the first direction X may gradually increase.

In some embodiments, still as shown in FIG. 3 and FIG. 4, along the first direction X, a semiconductor channel 113 includes a first region 123, a second region 133, and a third region 143; and the sub transistor structure 110 includes the semiconductor channel 113 in the first region 123 and a gate structure 120, where the gate structure 120 covers a side wall/top surface/bottom surface, extending along the first direction X, of the first region 123. In an example, along the third direction Z, the gate structure 120 includes a gate dielectric layer 130 and a gate conducting layer 140 that are sequentially stacked. The gate dielectric layer 130 covers a side wall/top surface/bottom surface, extending along the first direction X, of the first region 123. The gate conducting layer 140 covers a side wall/bottom surface, away from the first region 123 and extending along the first direction X, of the gate dielectric layer 130. It can be understood that the gate conducting layer 140 may be made of at least one of conductive materials such as titanium nitride, tungsten, or silver; and the gate dielectric layer 130 may be made of at least one of insulating materials such as silicon oxide, silicon nitride, or silicon oxynitride.

In addition, in some embodiments, the bottom electrode layer 121 in the sub capacitor structure 111 includes the semiconductor channel 113 in the third region 143 and a sub bottom electrode layer 151. The sub bottom electrode layer 151 covers a portion of side wall/top surface, extending along the first direction X, of the third region 143. The capacitor dielectric layer 131 covers a side wall/top surface, away from the third region 143 and extending along the first direction X, of the sub bottom electrode layer 151. The top electrode layer 141 covers a side wall/top surface, away from the sub bottom electrode layer 151 and extending along the first direction X, of the sub capacitor dielectric layer 131. The sub capacitor structure 111 is electrically connected to the sub transistor structure 110 through the second region 133, that is, a signal in the sub transistor structure 110 is transmitted to the sub capacitor structure 111 for storage through the second region 133, or a signal stored in the sub capacitor structure 111 is transmitted to the sub transistor structure 110 through the second region 133.

In some embodiments, the top electrode layer 141 may include a diffusion impervious layer (not shown in the figure) and a sub top electrode layer (not shown in the figure) that are sequentially stacked. The diffusion impervious layer covers a side wall/top surface, away from the sub bottom electrode layer 151 and extending along the first direction X, of the capacitor dielectric layer 131. The sub top electrode layer covers a side wall/top surface, away from the capacitor dielectric layer 131 and extending along the first direction X, of the diffusion impervious layer. The diffusion impervious layer prevents diffusion of a conducting material in the sub top electrode layer toward the capacitor dielectric layer 131, to ensure good insulation performance of the capacitor dielectric layer 131 and good conductivity of the sub top electrode layer. In an example, the diffusion impervious layer may be made of titanium nitride; the sub top electrode layer and the sub bottom electrode layer 151 may both be made of at least one of conducting materials such as polysilicon, titanium nitride, or tungsten; and the capacitor dielectric layer 131 may be made of a dielectric material with a high dielectric constant such as hafnium oxide, chromium oxide, or zirconium oxide.

In some embodiments, as shown in FIG. 3, top electrode layers 141 in a plurality of sub capacitor structures 111 may be in contact with each other. In actual application, a plurality of sub capacitor structures 111 in one storage structure 103 may share one top electrode layer 141. The top electrode layer 141 may be made of polysilicon or silicon germanium.

In some embodiments, as shown in FIG. 2, the semiconductor structure may further include: an electric connection layer 150 extending along the second direction Y. Moreover, along the second direction Y, one end of the electric connection layer 150 is in contact with and connected to the transistor structure 100, and the other end is in contact with and connected to the wordline staircase structure 102. It can be understood that the wordline staircase structure 102 is electrically connected to the transistor structure 100 through the electric connection layer 150.

In some embodiments, the step structure 112 may include a supporting layer 153, a dielectric layer 132, and a conducting layer 122. The supporting layer 153 and the semiconductor channel 103 may be integrated, the dielectric layer 132 and the gate dielectric layer 130 may be integrated, and the conducting layer 122 and the gate conducting layer 140 may be integrated. In an example, the electric connection layer 150 is in contact with and connected to the gate conducting layer 140 in the transistor structure 100, and the electric connection layer 150 and the gate conducting layer 140 in the transistor structure 100 are on a same layer. The electric connection layer 150 is in contact with and connected to the conducting layer 122 in the wordline staircase structure 102, and the electric connection layer 150 and the conducting layer 122 in the wordline staircase structure 102 are on a same layer. As can be learned, the conducting layer 122 is electrically connected to the gate conducting layer 140 through the electric connection layer 150, so that the step structure 112 is electrically connected to the sub transistor structure 110.

In another embodiment, the step structure may include a conducting layer, and the conducting layer is electrically connected to a gate conducting layer through an electric connection layer, and the conducting layer and a sub transistor structure are on a same layer.

In some embodiments, still as shown in FIG. 3 and FIG. 4, the semiconductor structure may further include a first dielectric layer 107, located between neighboring sub transistor structures 110 to implement electrical insulation between the neighboring sub transistor structures 110. The first dielectric layer 107 is further located between neighboring step structures 112 to implement electrical insulation between the neighboring step structures 112. Along the second direction Y, there is a gap between neighboring storage structures 103, and the first dielectric layer 107 is further located in the gap. It can be understood that the width of the electric connection layer 150 in the second direction Y is equal to the width of the gap in the second direction Y.

It should be noted that the electric connection layers 150 are in a one-to-one correspondence with the sub transistor structures 110, that is, there are a plurality of electric connection layers 150 sequentially disposed along the third direction Z, and the first dielectric layer 107 is further configured to insulate the plurality of electric connection layers 150.

In some embodiments, as shown in FIG. 1 to FIG. 4, the semiconductor structure further includes a support structure 104, where the support structure 104 is located between neighboring sub capacitor structures 111 in the capacitor structure 101, and the support structure 104 covers a portion of side wall of the sub capacitor structures 111 to support the capacitor structure 101.

It can be understood that, as shown in FIG. 1, as the requirement on the capacitor structure 101 with a large electric capacity increases, the structural length of the capacitor structure 101 in the first direction X is relatively long, so that the support structure 104 covers a portion of side wall of the sub capacitor structure 101 to fasten and support the capacitor structure 101 with a relatively long length, avoid collapse of the capacitor structure 101, and improve the stability of the semiconductor structure. In addition, as shown in FIG. 4, the sub capacitor structure 111 includes the semiconductor channel 113 in the third region 143. The support structure 104 and the sub bottom electrode layer 151 cover the side wall/top surface, extending along the first direction X, of the third region 143.

It should be noted that FIG. 1 is illustrated by using an example in which the support structure 104 includes three support layers. In actual application, the support structure 104 may include one support layer, and the support layer covers a middle side wall of the sub capacitor structure 111; or the support structure 104 may include two or four support layers, the plurality of support layers cover a portion of side wall of the sub capacitor structure 111, and the plurality of support layers are evenly arranged along the structural length of the sub capacitor structure 111 in the first direction X, that is, the quantity of support layers and the arrangement manner of the support layers included in the support structure 104 are not limited in this embodiment of this disclosure, and may be adjusted as needed.

The following describes the support structure 104 in detail with reference to FIG. 1 to FIG. 4.

In some embodiments, as shown in FIG. 2, the transistor structure 100, the capacitor structure 101, and the wordline staircase structure 102 form a storage structure 103. A plurality of storage structures 103 are disposed along both the first direction X and the second direction Y. The semiconductor structure further includes a support structure 104 shared by the plurality of storage structures 103. The support structure 104 extends along the second direction Y and covers capacitor structures 101 in the plurality of storage structures 103 arranged along the second direction Y.

It can be understood that the plurality of storage structures 103 extending along the second direction Y can share the support structure 104, so that one support structure 104 can fasten and support a plurality of capacitor structures 101 to improve the stability of the semiconductor structure.

In some embodiments, as shown in FIG. 1 to FIG. 4, there is a first gap between a step structure 112 in one of two neighboring storage structures 103 along the first direction X and a capacitor structure 101 in the other storage structure 103; and the support structure 104 includes a first support layer 114. The first support layer 114 extends along the second direction Y and covers a portion of side wall, extending along the first direction X, of the bottom electrode layer 121, and the first support layer 114 is located in the first gap. The first support layer 114 is further configured to space two neighboring storage structures 103.

As can be understood, that the first support layer 114 covers a portion of side wall, extending along the first direction X, of the bottom electrode layer 121 means that the first support layer 114 covers the portion of side wall at the third region 143, of the bottom electrode layer 121. In an example, the first support layer 114 may fully occupy the first gap, and can implement electrical isolation between the step structure 112 in one of the two storage structures 103 and the capacitor structure 101 in the other storage structure 103 while fastening and supporting the capacitor structure 101, to prevent electrical interference between the neighboring storage structures 103.

In some embodiments, as shown in FIG. 4, the sub transistor structure 110 includes a portion of semiconductor channel 113 extending along the first direction X and a gate structure 120 covering the side wall/top surface, extending along the first direction X, of the semiconductor channel 113. The bottom electrode layer 121 includes a portion of semiconductor channel 113 extending along the first direction X. The support structure 104 further includes: a second support layer 124, where the second support layer 124 extends along the second direction Y and covers a portion of side wall/top (or bottom) surface of the semiconductor channel 113, and the second support layer 124 is located between the gate structure 120 and the capacitor structure 101 and is located between neighboring step structures 112; and a third support layer 134, where the third support layer 134 extends along the second direction Y and covers a portion of side wall of the semiconductor channel 113 in the bottom electrode layer 121, and the third support layer 134 is located on a side of the first support layer 114 away from the second support layer 124.

As can be learned from the foregoing description, along the third direction Z, the gate structure 120 may include the gate dielectric layer 130 and the gate conducting layer 140 that are sequentially stacked.

It can be understood that the first support layer 114, the second support layer 124, and the third support layer 134 separately cover different parts of side wall (e.g., top or bottom surface) of the semiconductor channel 113 to support the semiconductor channel 113. In addition, because the second support layer 124 covers a plurality of stack structures arranged along the second direction Y, the second support layer 124 further covers a portion of side wall of the supporting layer 153 in the step structure 112 while covering the side wall of the second region.

The following describes the first support layer 114, the second support layer 124, and the third support layer 134 in detail with reference to a specific example.

In an example, as shown in FIG. 4, the semiconductor channel 113 includes a first region 123, a second region 133, and a third region 143 along the first direction X, the gate structure 120 covers a side wall of the first region 123, the second support layer 124 covers a side wall of the second region 133, the bottom electrode layer 121 includes the third region 143 and a sub bottom electrode layer 151 that covers a portion of side wall of the third region 143, and the first support layer 114 and the third support layer 134 cover a remaining portion of side wall of the third region 143.

It should be noted that the side wall of the first region 123, the side wall of the second region 133, and the side wall of the third region 143 are the side wall, extending along the first direction X, of the semiconductor channel 113. It can be understood that the second support layer 124 covers the side wall of the second region 133, so that the second support layer 124 can fasten and support both the transistor structure 100 and the capacitor structure 101, and can implement electrical isolation between the gate structure 120 and the sub bottom electrode layer 151 or the top electrode layer 141. The first support layer 114, the third support layer 134, and the sub bottom electrode layer 151 cover the side wall, extending along the first direction X, of the third region 143 together. The first support layer 114 and the third support layer 134 fasten and support the capacitor structure 101 together.

In some embodiments, as shown in FIG. 3, the semiconductor structure may further include: a plurality of first conducting columns 115 extending along the third direction Z, where the first conducting columns 115 are in a one-to-one correspondence with the step structures 112, and the first conducting columns 115 are in contact with and connected to the step structures 112; and a plurality of second conducting columns 125 extending along the third direction Z, where the second conducting columns 125 are in contact with and connected to the top electrode layer 141.

It can be understood that the step structures 112 are in a one-to-one correspondence with the sub transistor structures 110, and the first conducting columns 115 are in a one-to-one correspondence with the sub transistor structures 110, so that different sub transistor structures 110 can be controlled by using different first conducting columns 115. In an example, the first conducting columns 115 are in contact with and connected to conducting layers 122 in the step structures 112, and the second conducting columns 125 are in contact with and connected to top electrode layers 141 in the capacitor structures 101.

It should be noted that FIG. 1, FIG. 3, and FIG. 4 are illustrated by using an example in which there are three sub transistor structures 110 stacked along the third direction Z. In actual application, the quantity of sub transistor structures 110 stacked along the third direction Z is not limited, and may be designed as needed.

In some embodiments, as shown in FIG. 3, the sub transistor structure 110 on the top has a first dielectric layer 107, and the first dielectric layer 107 is further located between the sub transistor structure 110 on the top and the sub capacitor structure 111 on the top, and may further be located on a surface of the wordline staircase structure 102. The semiconductor structure may further include: a second dielectric layer 137, located on top surfaces of the first dielectric layer 107 and the sub capacitor structure 111 on the top to protect the sub capacitor structure 111; and a third dielectric layer 147, located on a top surface of the second dielectric layer 137 and covering side walls of the first conducting column 115 and the second conducting column 125. Top surfaces of the third dielectric layer 147, the first conducting column 115, and the second conducting column 125 are flush. Both the first conducting column 115 and the second conducting column 125 penetrate the second dielectric layer 137 and the third dielectric layer 147.

It can be understood that the second dielectric layer 137 and the third dielectric layer 147 support the first conducting column 115 and the second conducting column 125 together and make the semiconductor structure flat.

In some embodiments, as shown in FIG. 1, the semiconductor structure may further include a bit line 135. The bit line 135 is in contact with and connected to a side of the transistor structure 100 away from the capacitor structure 101, so that the bit line 135 is electrically connected to the transistor structure 100. The bit line 135 may extend along the third direction Z.

In conclusion, along the first direction X, the transistor structure 100 is neighboring to the capacitor structure 101; and along the second direction Y, the transistor structure 100 is neighboring to the wordline staircase structure 102. In this way, while the transistor structure 100 is electrically connected to the wordline staircase structure 102, the total structural length of the transistor structure 100, the capacitor structure 101, and the wordline staircase structure 102 in the first direction X is reduced. In addition, a portion of region, extending along the first direction X, of the wordline staircase structure 102 faces the capacitor structure 101. In this way, the wordline staircase structure 102 can be extended along the first direction X as long as possible while the structural length of the wordline staircase structure 102 in the second direction Y is reduced, so as to increase the length of the transition region between the wordline staircase structure 102 and the capacitor structure 101, effectively use the layout space, and reduce the total layout area of the semiconductor structure, thereby improving the packing density of the transistor structure 100 and the capacitor structure 101 in the semiconductor structure.

Another embodiment of this disclosure further provides a manufacturing method for a semiconductor structure to manufacture the semiconductor structure provided in the foregoing embodiments. The manufacturing method for a semiconductor structure provided in the another embodiment of this disclosure is described in detail below with reference to FIG. 1 to FIG. 16. FIG. 5 to FIG. 16 are schematic structural diagrams corresponding to various steps of a manufacturing method for a semiconductor structure according to another embodiment of this disclosure. It should be noted that the parts the same as or corresponding to the foregoing embodiments are not described herein again.

As shown in FIG. 5 to FIG. 16, the manufacturing method for the semiconductor structure includes: forming a transistor structure 100 and a capacitor structure 101 that are arranged along a first direction X, where the capacitor structure 101 extends along the first direction X; and forming a wordline staircase structure 102, where the wordline staircase structure 102 and the transistor structure 100 are disposed along a second direction Y, the wordline staircase structure 102 extends along the first direction X, the first direction X intersects the second direction Y, and the wordline staircase structure 102 is electrically connected to the transistor structure 100, where a plane perpendicular to the second direction Y is used as a reference plane, an orthographic projection of the transistor structure 100 on the reference plane is a first projection, an orthographic projection of the capacitor structure 101 on the reference plane is a second projection, an orthographic projection of the wordline staircase structure 102 on the reference plane is a third projection, the third projection covers the first projection, and the third projection partially overlaps the second projection.

In some embodiments, the wordline staircase structure 102 and the transistor structure 100 are formed by using a same preparation step. In this way, the manufacturing process of the semiconductor structure is simplified and the manufacturing costs of the semiconductor structure are reduced. How to form the wordline staircase structure 102 and the transistor structure 100 by using the same preparation step will be described in detail below with reference to specific embodiments.

In some embodiments, as shown in FIG. 3, the capacitor structure 101 includes a plurality of sub capacitor structures 111 arranged along a third direction Z. The manufacturing method may further include: forming a support structure 104, where the support structure 104 is located between neighboring sub capacitor structures 111 in the capacitor structure 101, and the support structure 104 covers a portion of side wall of the sub capacitor structure 111 to support the capacitor structure 101. How to form the support structure 104 will be described in detail below with reference to specific embodiments.

Figure 5:
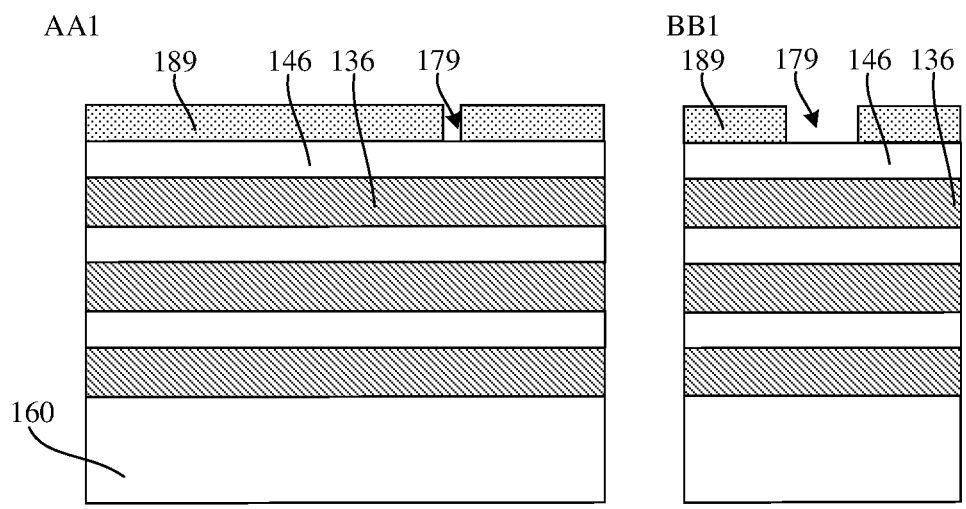
FIG. 5 to FIG. 16 are schematic structural diagrams corresponding to various steps of a manufacturing method for a semiconductor structure according to another embodiment of this disclosure.
Figure 6:
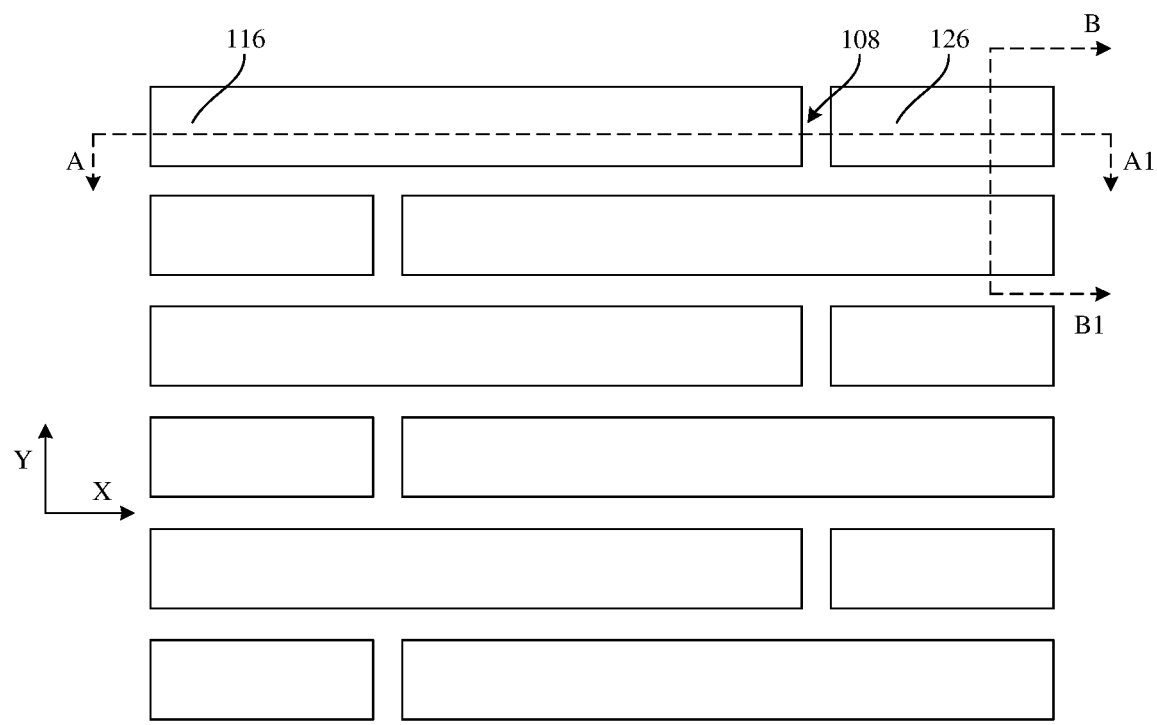

In some embodiments, the support structure 104 includes a first support layer 114, and forming the first support layer 114 may include the following steps:

As shown in FIG. 5 and FIG. 6, a first stack structure 116 and a second stack structure 126 that are disposed and staggered along the first direction X are formed, and the first stack structure 116 and the second stack structure 126 are disposed and staggered along the second direction Y.

It should be noted that two neighboring first stack structures 116 are centrosymmetric, and two neighboring second stack structures 126 are centrosymmetric. The first stack structure 116 is configured to subsequently form a transistor structure and a capacitor structure. The second stack structure 126 is configured to subsequently form a wordline step structure.

In some embodiments, the step of forming the first stack structure 116 and the second stack structure 126 may include: as shown in FIG. 5, forming an initial first semiconductor layer 136 and an initial second semiconductor layer 146 that are sequentially stacked along the third direction Z, where a material of the initial first semiconductor layer 136 is different from that of the initial second semiconductor layer 146. In an example, the material of the initial first semiconductor layer 156 is silicon germanium, and the material of the initial second semiconductor layer 146 is silicon.

In some embodiments, before the forming an initial first semiconductor layer 136 and an initial second semiconductor layer 146, the method further includes: providing a substrate 160, and subsequently forming the initial first semiconductor layer 136 and the initial second semiconductor layer 146 on the substrate 160.

Figure 7:
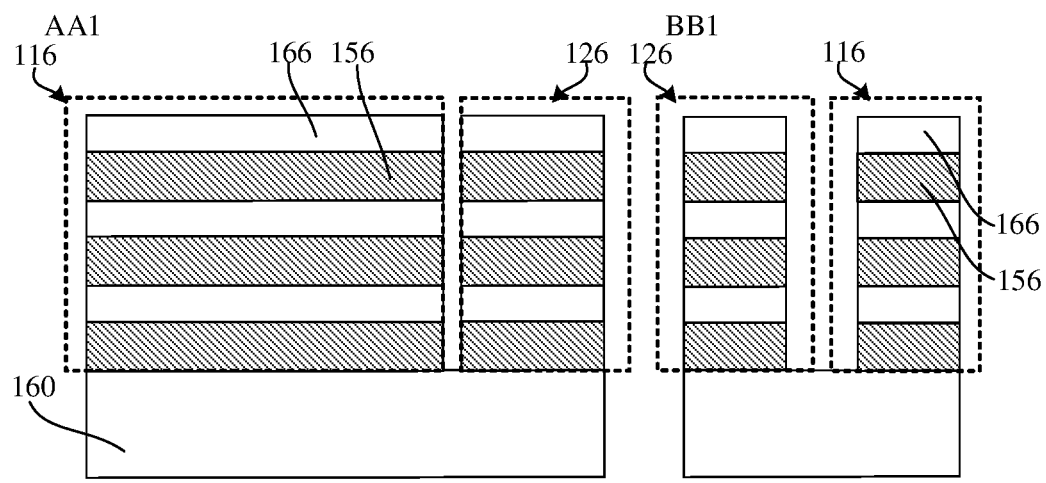

As shown in FIG. 5, FIG. 6, and FIG. 7, the initial first semiconductor layer 136 and the initial second semiconductor layer 146 are patterned to form the first stack structure 116 and the second stack structure 126. In an example, a fourth mask layer 189 having a fifth opening 179 is used as a mask to pattern the initial first semiconductor layer 136 and the initial second semiconductor layer 146, so as to form a first semiconductor layer 156 and a second semiconductor layer 166. In this way, along the third direction Z, the first stack structure 116 and the second stack structure 126 each include a first semiconductor layer 156 and a second semiconductor layer 166 that are alternately stacked. The region in which the first semiconductor layer 156 is located is subsequently used to form a gate structure in the sub transistor structure and a sub bottom electrode layer, a capacitor dielectric layer, and a top electrode layer in the sub capacitor structure. The second semiconductor layer 166 is subsequently used to form a semiconductor channel.

It can be understood that the top view of the fourth mask layer 189 is also shown in FIG. 6, and the fifth opening 179 is shown by the gap between the first stack structure 116 and the second stack structure 126 in FIG. 6.

FIG. 7 is a schematic partial section view of the semiconductor structure shown in FIG. 6 taken along the first cross-section direction AA1 and the second cross-section direction BB1. It should be noted that six first stack structures 116 and six second stack structures are shown in FIG. 6. In actual application, the quantity of first stack structures 116 and the quantity of second stack structures 126 may be properly designed based on a requirement on the transistor structure. FIG. 5 and FIG. 7 are illustrated by using an example in which the first stack structure 116 and the second stack structure 126 each include three first semiconductor layers 156 and three second semiconductor layers 166. In actual application, the quantity of first semiconductor layers 156 and the quantity of second semiconductor layers 166 may be properly designed based on a requirement on the transistor structure. FIG. 8 to FIG. 16 show advanced manufacturing processes based on FIG. 6 and FIG. 7.

Figure 8:
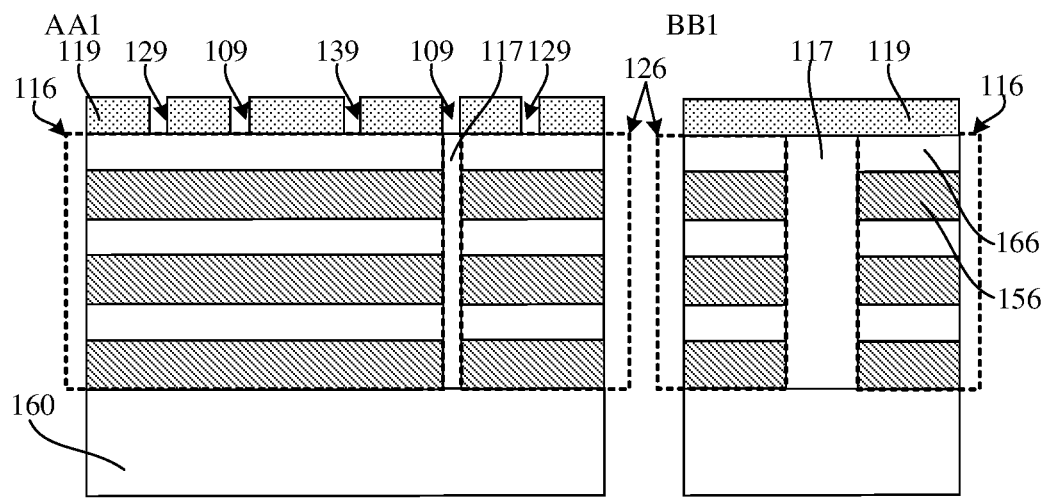

As shown in FIG. 8, a first sacrificial layer 117 is formed, where the first sacrificial layer 117 fully occupies the first gap 108 (as shown in FIG. 6) between the first stack structure 116 and the second stack structure 126. As can be learned from the foregoing descriptions, along the third direction Z, the first stack structure 116 and the second stack structure 126 each may include a first semiconductor layer 156 and a second semiconductor layer 166 that are alternately stacked; and the third direction Z, the second direction Y, and the first direction X intersect each other.

Still as shown in FIG. 8, a first mask layer 119 having a first opening 109 is formed, the first opening 109 extends along the second direction Y, and the first opening 109 exposes a portion of the first sacrificial layer 117. It can be understood that the first opening 109 faces the region, extending along the second direction Y, of the first gap 108 (as shown in FIG. 6); and along the second direction Y, the first opening 109 exposes a portion of region of a plurality of first stack structures 116.

Figure 9:
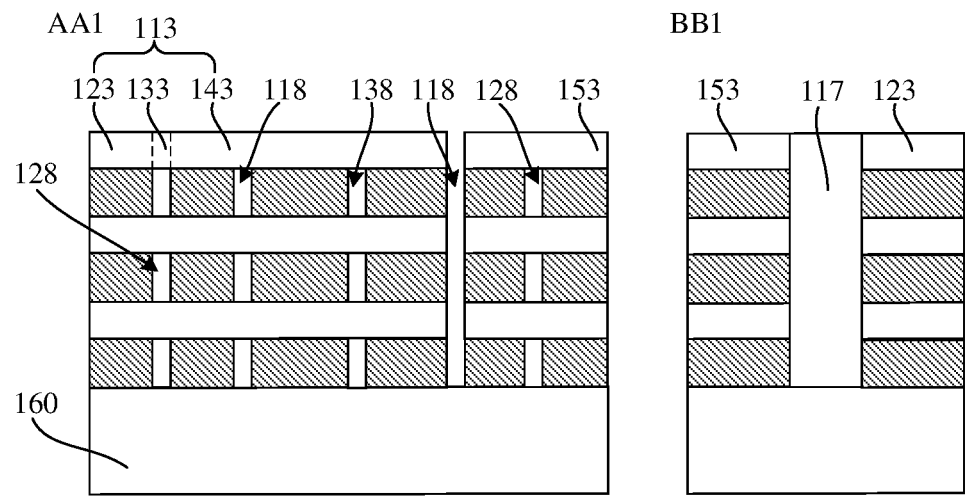

As shown in FIG. 8 and FIG. 9, the first mask layer 119 is used as a mask, and the first sacrificial layer 117 exposed by the first opening 109 and the first semiconductor layer 156 facing the first opening 109 are etched to form a first hole 118. It can be understood that a material of the first semiconductor layer 156 is different from that of the second semiconductor layer 166. Therefore, the material of the first sacrificial layer 117 and the material of the first semiconductor layer 156 can be etched by using a same etching process, but the etching process does not remove the second semiconductor layer 166, so that after the first sacrificial layer 117 exposed by the first opening 109 is etched, a portion of first semiconductor layer 156 facing the first opening 109 can be exposed. Further, this portion of first semiconductor layer 156 can be removed to form the first hole 118, and the first hole 118 exposes a side wall of the third region 143 facing the first opening 109.

Figure 10:
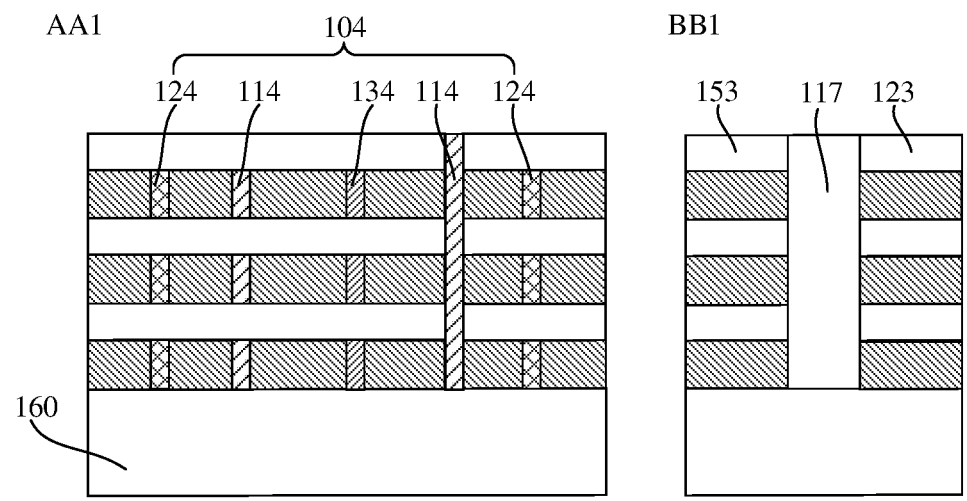

As shown in FIG. 10, a first support layer 114 is formed, and the first support layer 114 fully occupies the first hole 118.

In some embodiments, as shown in FIG. 8 to FIG. 10, the second semiconductor layer 166 in the first stack structure 116 is a semiconductor channel 113. Along the first direction X, the semiconductor channel 113 includes a first region 123, a second region 133, and a third region 143 (as shown in FIG. 4). The support structure 104 further includes a second support layer 124 and a third support layer 134.

As shown in FIG. 8, the step of forming a first mask layer 119 may further include: forming a first mask layer 119 having a second opening 129 and a third opening 139, where the second opening 129 extends along the second direction Y, the second opening 129 exposes the second region 133 and the first sacrificial layer 117 that is in contact with the second region 133, the third opening 139 extends along the second direction Y, and the third opening 139 exposes a portion of first sacrificial layer 117 between neighboring first stack structures 116.

The second semiconductor layer 166 in the second stack structure 126 may be used as the supporting layer 153 in the step structure. The second opening 129 exposes a portion of supporting layer 153.

As shown in FIG. 9 and FIG. 10, forming a second support layer 124 includes the following steps:

As shown in FIG. 9, the first mask layer 119 is used as a mask, the first sacrificial layer 117 exposed by the second opening 129 and the first semiconductor layer 156 facing the second opening 129 are etched to form a second hole 128. It can be understood that the etching process can expose a portion of first semiconductor layer 156 facing the second opening 129 after etching the first sacrificial layer 117 exposed by the second opening 129, and can further remove this portion of first semiconductor layer 156 to form the second hole 128. The second hole 128 exposes a side wall of the second region 133 facing the second opening 129.

As shown in FIG. 10, a second support layer 124 fully occupying the second hole 128 is formed.

As shown in FIG. 9 and FIG. 10, a step of forming a third support layer 134 includes the following step:

As shown in FIG. 9, the first mask layer 119 is used as a mask, and the first sacrificial layer 117 exposed by the third opening 139 and the first semiconductor layer 156 facing the third opening 139 are etched to form a third hole 138. It can be understood that the etching process can expose a portion of first semiconductor layer 156 facing the third opening 139 after etching the first sacrificial layer 117 exposed by the third opening 13, and further can remove this portion of first semiconductor layer 156 to form the third hole 138. The third hole 138 exposes a side wall of the third region 143 facing the third opening 139.

As shown in FIG. 10, the third support layer 134 fully occupying the third hole 138 is formed.

It can be understood that the first hole 118, the second hole 128, and the third hole 138 may be formed simultaneously; and the first support layer 114, the second support layer 124, and the third support layer 134 may be formed simultaneously to simply the process steps of manufacturing the support structure 104.

Figure 11:
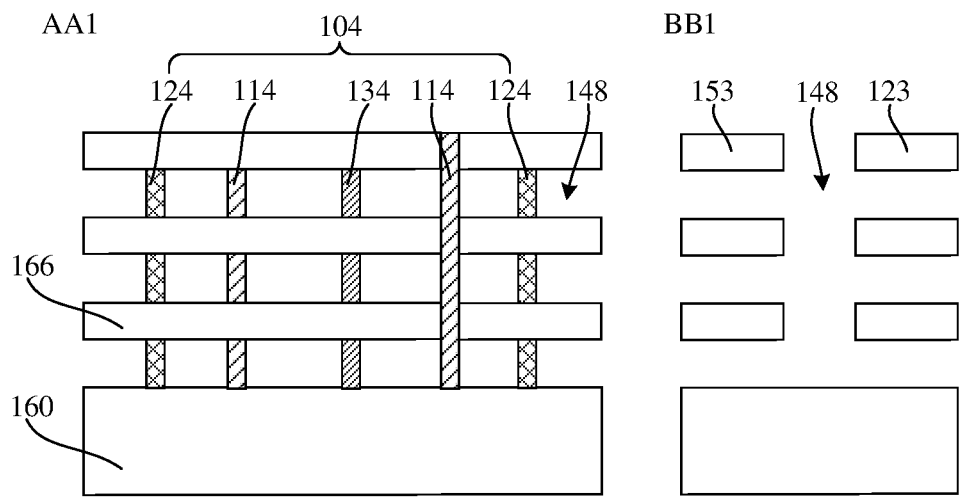

In some embodiments, forming the transistor structure 100 may include the following step:

With reference to FIG. 10 and FIG. 11, the second semiconductor layer 166 and the support structure 104 are used as masks, and the remaining parts of first semiconductor layer 156 and first sacrificial layer 117 are removed to form a fourth hole 148. It can be understood that in this step, the support structure 194 covers a portion of side wall of the second semiconductor layer 166. Therefore, after the first semiconductor layer 156 and the first sacrificial layer 117 are removed, the second semiconductor layer 166 does not collapse.

Figure 12:
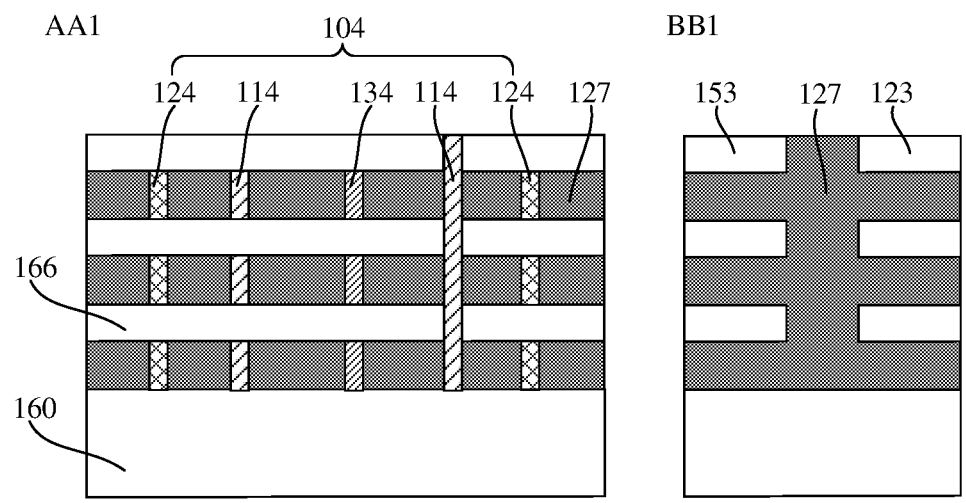

As shown in FIG. 12, a second sacrificial layer 127 fully occupying the fourth hole 148 is formed.

Figure 13:
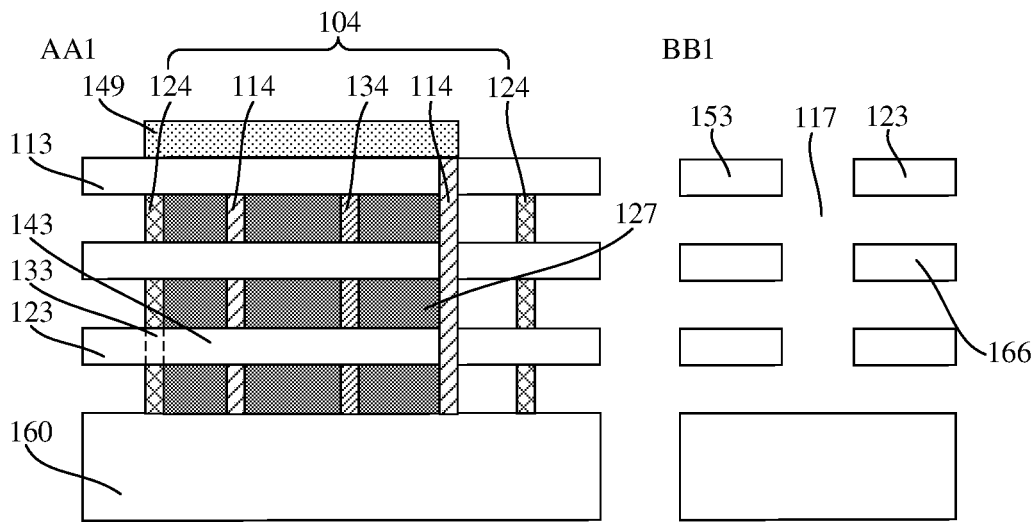

As shown in FIG. 13, a second mask layer 149 is formed, where the second mask layer 149 is located in the third region 143 of the semiconductor channel 113, and is configured to prevent the second sacrificial layer 127 facing the third region 143 from being etched. The second mask layer 149 is used as a mask, the second sacrificial layer 127 in contact with the first region 123 of the semiconductor channel 113 is removed, and the second sacrificial layer 127 in contact with the second stack structure 126 is removed.

Figure 14:
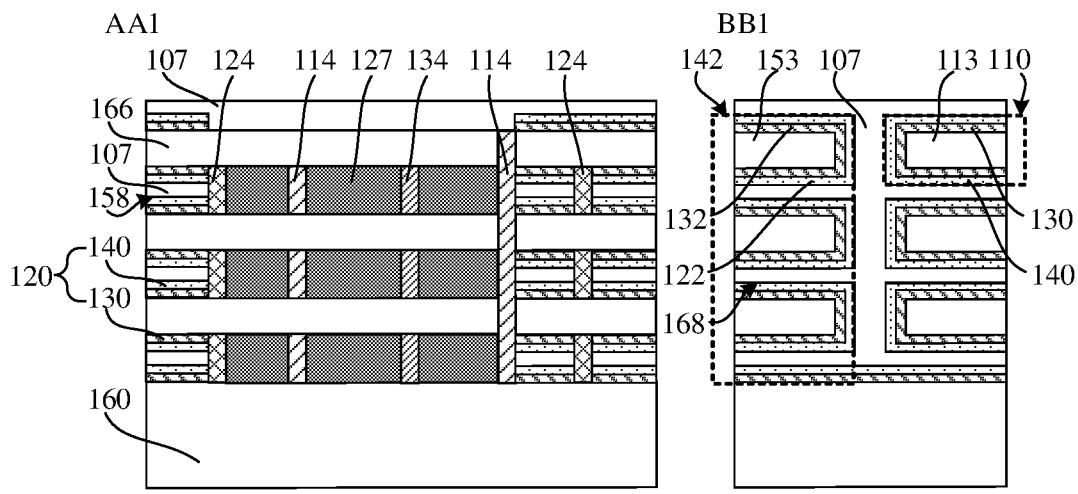

As shown in FIG. 14, a gate structure 120 and a conducting layer 122 are formed. The gate structure 120 covers a side wall of the first region 123 of the semiconductor channel 113. The conducting layer 122 covers a side wall of the second semiconductor layer 166 in the second stack structure 126 (as shown in FIG. 8). The transistor structure 100 includes the gate structure 120 and the first region 123. The conducting layer 122 and a second semiconductor layer 166 in the second stack structure 126 form an initial wordline staircase structure 142.

A dielectric layer 132 is provided between the conducting layer 122 and the second semiconductor layer 166 in the second stack structure 126. The second semiconductor layer 166 in the second stack structure 126 is a supporting layer 153. The dielectric layer 132 and the gate dielectric layer 130 are integrated. The conducting layer 122 and the gate conducting layer 140 are integrated. A step of forming the gate structure 120, the conducting layer 122, and the dielectric layer 132 includes: forming the conducting layer 122 and the gate conducting layer 140, where the conducting layer 122 and the gate conducting layer 140 conformally cover the side wall extending along the first direction X and exposed by the second semiconductor layer 166 in FIG. 13; and forming the dielectric layer 132 and the gate dielectric layer 130, where the dielectric layer 132 and the gate dielectric layer 130 conformally cover the conducting layer 122 and the side wall, extending along the first direction X, of the gate conducting layer 140.

The semiconductor channel 113 of the first region 123 and the gate structure 120 form the sub transistor structure 110. The second semiconductor layer 166, the dielectric layer 132, and the conducting layer 122 in the second stack structure 126 form the initial wordline staircase structure 142. A plurality of sub transistor structures 110 arranged along the third direction Z form the transistor structure 100.

In some embodiments, still as shown in FIG. 14, along the third direction Z, there is a second gap 158 between gate structures 120 covering side walls of different first regions 123, and there is a third gap 168 between conducting layers 122 covering side walls of first semiconductor layers 136 in different second stack structures 126. The manufacturing method further includes: forming a first dielectric layer 107, where the first dielectric layer 107 fully occupies the second gap 158 and the third gap 168.

Figure 15:
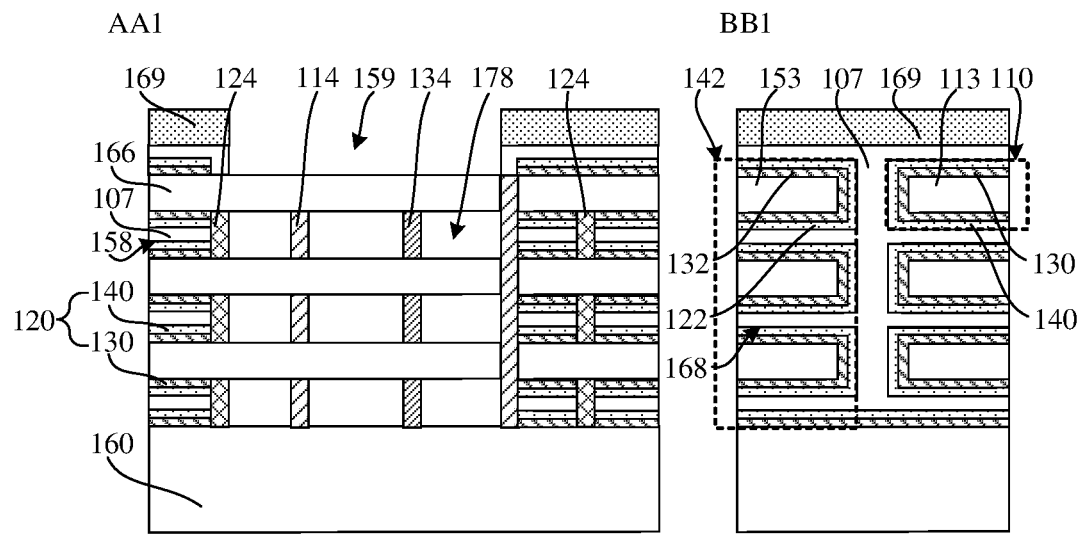

In some embodiments, as shown in FIG. 15, a step of forming the capacitor structure 101 may include: forming a third mask layer 169 having a fourth opening 159, where the fourth opening 159 is located in the third region 143 (as shown in FIG. 13) of the semiconductor channel 113 to protect the sub transistor structure 110 and the step structure 112.

Still as shown in FIG. 15, the third mask layer 169 is used as a mask, and the second sacrificial layer 127 in contact with the third region 143 (as shown in FIG. 9) is removed to form a fifth hole 178.

It should be noted that the first dielectric layer 107 is formed on a top surface of the third region 143 on the top. Therefore, when the second sacrificial layer 127 is removed, the first dielectric layer 107 on the top surface of the third region 143 is removed to expose the entire side wall, extending along the first direction X, of the third region 143 on the top.

Figure 16:
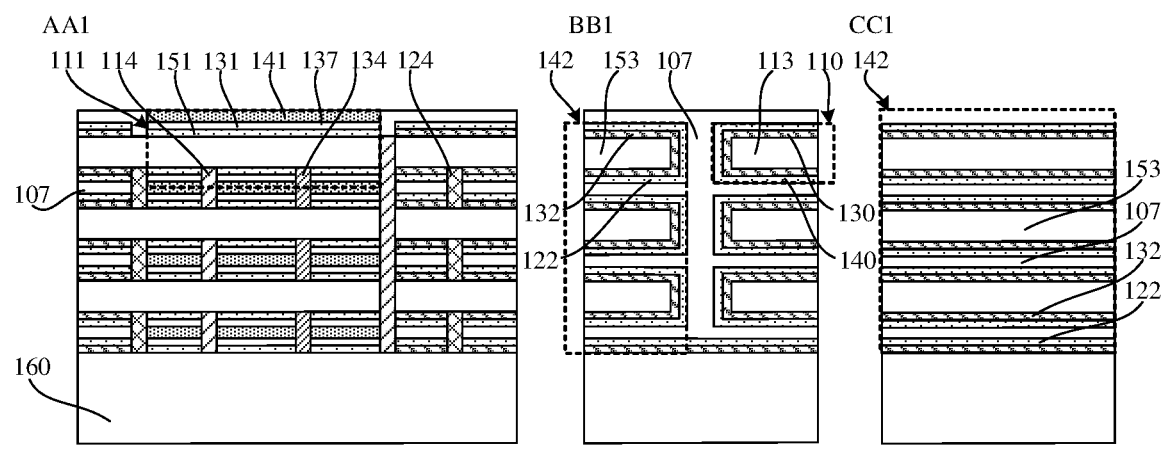

As shown in FIG. 15 and FIG. 16, a sub bottom electrode layer 151 is formed, where the sub bottom electrode layer 151 covers a side wall of the semiconductor channel 113 exposed by the fifth hole 178; a capacitor dielectric layer 131 is formed, where the capacitor dielectric layer 131 covers a side wall of the sub bottom electrode layer 151 away from the semiconductor channel 113; and a top electrode layer 141 is formed, where the top electrode layer 141 fully occupies the fifth hole 178. The semiconductor channel 113 of the third region 143 and the sub bottom electrode layer 151 form the bottom electrode layer 121. The bottom electrode layer 121, the capacitor dielectric layer 131, and the top electrode layer 141 form the capacitor structure 101.

It can be understood that for a third region 143, the third region 143, and the sub bottom electrode layer 151, the capacitor dielectric layer 131, and the top electrode layer 141 that sequentially cover the side wall of the third region 143 form a sub capacitor structure 111. A plurality of sub capacitor structures 111 arranged along the third direction Z (as shown in FIG. 1) form a capacitor structure 101.

It should be noted that in the step of forming the sub bottom electrode layer 151, the capacitor dielectric layer 131, and the top electrode layer 141, the sub bottom electrode layer 151, the capacitor dielectric layer 131, and the top electrode layer 141 may further cover the top surface of the first dielectric layer 107. Subsequently, flatting processing is performed to form the capacitor structure 101 shown in FIG. 16.

In some embodiments, the step of forming the top electrode layer 141 may include: forming a diffusion impervious layer (not shown in the figure) and a sub top electrode layer (not shown in the figure) that are sequentially stacked, where the diffusion impervious layer covers a side wall (top surface), away from the sub bottom electrode layer 151 and extending along the first direction X, of the capacitor dielectric layer 131; and the sub top electrode layer covers a side wall (top surface), away from the capacitor dielectric layer 131 and extending along the first direction X, of the diffusion impervious layer.

In some embodiments, as shown in FIG. 16 and FIG. 3, a step of forming the wordline staircase structure 102 may include: partially etching the initial wordline staircase structure 142 and the first semiconductor layer 136 in the second stack structure 126 for a plurality of times to form the wordline staircase structure 102, where the wordline staircase structure 102 includes a plurality of step structures 112 disposed along the third direction Z, and the lengths of the plurality of step structures 112 in the first direction X are different.

It can be understood that the dielectric layer 132 in the wordline staircase structure 102 and the gate dielectric layer 130 in the transistor structure 100 are formed by using a same preparation step, and the conducting layer 122 in the wordline staircase structure 102 and the gate conducting layer 140 in the transistor structure 100 are formed by using a same preparation step.

It should be noted that a manufacturing method for forming a plurality of step structures 112 having different lengths in the first direction X is not limited in this embodiment of this disclosure, provided that the wordline staircase structure 102 shown in FIG. 3 can be formed.

In some embodiments, as shown in FIG. 3, the manufacturing method may further include: forming a plurality of first conducting columns 115 extending along the third direction Z, where the first conducting columns 115 are in a one-to-one correspondence with the step structures 112, and the first conducting columns 115 are in contact with and connected to the step structures 112; and forming a plurality of second conducting columns 125 extending along the third direction Z, where the second conducting columns 125 are in contact with and connected to the capacitor structure 101.

In conclusion, in the semiconductor structure formed by using the foregoing manufacturing method, along the first direction X, the transistor structure 100 is neighboring to the capacitor structure 101; and along the second direction Y, the transistor structure 100 is neighboring to the wordline staircase structure 102. In this way, while the transistor structure 100 is electrically connected to the wordline staircase structure 102, the total structural length of the transistor structure 100, the capacitor structure 101, and the wordline staircase structure 102 in the first direction X is reduced. In addition, a portion of region, extending along the first direction X, of the wordline staircase structure 102 faces the capacitor structure 101. In this way, the wordline staircase structure 102 can be extended along the first direction X as long as possible while the structural length of the wordline staircase structure 102 in the second direction Y is reduced, so as to increase the length of the transition region between the wordline staircase structure 102 and the capacitor structure 101, effectively use the layout space, and reduce the total layout area of the semiconductor structure, thereby improving the packing density of the transistor structure 100 and the capacitor structure 101 in the semiconductor structure.

A person of ordinary skill in the art can understand that the foregoing implementations are specific embodiments for implementing this disclosure. However, in actual application, forms and details of the foregoing implementations may be modified without departing from the spirit and scope of the embodiments of this disclosure. Any person skilled in the art can make changes and modifications without departing from the spirit and scope of the embodiments of this disclosure. Therefore, the protection scope of the embodiments of this disclosure shall be subject to the scope defined by the claims.

What is claimed is:

1. A semiconductor structure, comprising:
a transistor structure and a capacitor structure that are arranged along a first direction, wherein the capacitor structure extends along the first direction; and
a wordline staircase structure, wherein the wordline staircase structure and the transistor structure are disposed along a second direction, the wordline staircase structure extends along the first direction, the first direction intersects the second direction, and the wordline staircase structure is electrically connected to the transistor structure, wherein
a plane perpendicular to the second direction is configured as a reference plane, an orthographic projection of the transistor structure on the reference plane is a first projection, an orthographic projection of the capacitor structure on the reference plane is a second projection, an orthographic projection of the wordline staircase structure on the reference plane is a third projection, the third projection covers the first projection, and the third projection partially overlaps the second projection; the transistor structure, the capacitor structure, and the wordline staircase structure form a storage structure, two neighboring storage structures along the first direction are centrosymmetric, and a wordline staircase structure in one of the two storage structures and a capacitor structure in the other storage structure are disposed along the first direction.

2. The semiconductor structure according to claim 1, wherein the transistor structure comprises a plurality of sub transistor structures disposed along a third direction; and the third direction, the second direction, and the first direction intersect each other;
the capacitor structure comprises a plurality of sub capacitor structures arranged along the third direction, and the sub capacitor structure comprises a bottom electrode layer, a capacitor dielectric layer, and a top electrode layer that are sequentially stacked;
the wordline staircase structure comprises a plurality of step structures disposed along the third direction, the step structure extends along the first direction, and lengths of the plurality of step structures in the first direction are different; and
the sub transistor structures are connected to the sub capacitor structures in a one-to-one correspondence, and the sub transistor structures are connected to the step structures in a one-to-one correspondence.

3. The semiconductor structure according to claim 2, further comprising a support structure, wherein the support structure is located between neighboring sub capacitor structures in the capacitor structure, and the support structure covers a portion of side wall of the sub capacitor structures to support the capacitor structure.

4. The semiconductor structure according to claim 2, wherein the transistor structure, the capacitor structure, and the wordline staircase structure form a storage structure, and a plurality of storage structures are disposed along both the first direction and the second direction; and
the semiconductor structure further comprises a support structure shared by the plurality of storage structures, and the support structure extends along the second direction and covers capacitor structures in the plurality of storage structures arranged along the second direction.

5. The semiconductor structure according to claim 4, wherein there is a first gap between a step structure in one of two neighboring storage structures along the first direction and a capacitor structure in the other storage structure; and the support structure comprises a first support layer, the first support layer extends along the second direction and covers a portion of side wall, extending along the first direction, of the bottom electrode layer, and the first support layer is located in the first gap.

6. The semiconductor structure according to claim 5, wherein the sub transistor structure comprises a portion of semiconductor channel extending along the first direction and a gate structure covering a side wall, extending along the first direction, of the semiconductor channel; and the bottom electrode layer comprises the portion of semiconductor channel extending along the first direction; and
the support structure further comprises: a second support layer, wherein the second support layer extends along the second direction and covers a portion of side wall of the semiconductor channel, and the second support layer is located between the gate structure and the capacitor structure and is located between neighboring step structures; and a third support layer, wherein the third support layer extends along the second direction and covers a portion of side wall of the semiconductor channel in the bottom electrode layer, and the third support layer is located on a side of the first support layer away from the second support layer.

7. The semiconductor structure according to claim 6, wherein the semiconductor channel comprises a first region, a second region, and a third region along the first direction, the gate structure covers a side wall of the first region, the second support layer covers a side wall of the second region, the bottom electrode layer comprises the third region and a sub bottom electrode layer that covers a portion of side wall of the third region, and the first support layer and the third support layer cover a remaining portion of side wall of the third region.

8. The semiconductor structure according to claim 2, further comprising: a plurality of first conducting columns extending along the third direction, wherein the first conducting columns are in a one-to-one correspondence with the step structures, and the first conducting columns are in contact with and connected to the step structures; and a plurality of second conducting columns extending along the third direction, wherein the second conducting columns are in contact with and connected to the top electrode layer.

9. A manufacturing method for a semiconductor structure, comprising:
forming a transistor structure and a capacitor structure that are arranged along a first direction, wherein the capacitor structure extends along the first direction; and
forming a wordline staircase structure, wherein the wordline staircase structure and the transistor structure are disposed along a second direction, the wordline staircase structure extends along the first direction, the first direction intersects the second direction, and the wordline staircase structure is electrically connected to the transistor structure, wherein
a plane perpendicular to the second direction is used as a reference plane, an orthographic projection of the transistor structure on the reference plane is a first projection, an orthographic projection of the capacitor structure on the reference plane is a second projection, an orthographic projection of the wordline staircase structure on the reference plane is a third projection, the third projection covers the first projection, and the third projection partially overlaps the second projection; the transistor structure, the capacitor structure, and the wordline staircase structure form a storage structure, two neighboring storage structures along the first direction are centrosymmetric, and a wordline staircase structure in one of the two storage structures and a capacitor structure in the other storage structure are disposed along the first direction.

10. The manufacturing method according to claim 9, wherein the wordline staircase structure and the transistor structure are formed by using a same preparation step.

11. The manufacturing method according to claim 9, wherein the capacitor structure comprises a plurality of sub capacitor structures arranged along a third direction, and the manufacturing method further comprises: forming a support structure, wherein the support structure is located between neighboring sub capacitor structures in the capacitor structure, and the support structure covers a portion of side wall of the sub capacitor structures to support the capacitor structure.

12. The manufacturing method according to claim 11, wherein the support structure comprises a first support layer, and steps of forming the first support layer comprise:
forming a first stack structure and a second stack structure that are disposed and staggered along the first direction, and the first stack structure and the second stack structure are disposed and staggered along the second direction;
forming a first sacrificial layer, wherein the first sacrificial layer fully occupies a first gap between the first stack structure and the second stack structure, wherein
along the third direction, the first stack structure and the second stack structure each comprise a first semiconductor layer and a second semiconductor layer that are alternately stacked; and the third direction, the second direction, and the first direction intersect each other;
forming a first mask layer comprising a first opening, wherein the first opening extends along the second direction, and the first opening exposes a portion of the first sacrificial layer;
using the first mask layer as a mask, and etching the first sacrificial layer exposed by the first opening and the first semiconductor layer facing the first opening to form a first hole; and
forming the first support layer, wherein the first support layer fully occupies the first hole.

13. The manufacturing method according to claim 12, wherein steps of forming the first stack structure and the second stack structure comprise:
forming an initial first semiconductor layer and an initial second semiconductor layer that are sequentially stacked along the third direction; and
patterning the initial first semiconductor layer and the initial second semiconductor layer to form the first stack structure and the second stack structure.

14. The manufacturing method according to claim 12, wherein the second semiconductor layer in the first stack structure is a semiconductor channel; the semiconductor channel comprises a first region, a second region, and a third region along the first direction; and the support structure further comprises a second support layer and a third support layer;
the step of forming the first mask layer further comprises: forming the first mask layer comprising a second opening and a third opening, wherein the second opening extends along the second direction, the second opening exposes the second region and the first sacrificial layer in contact with the second region, the third opening extends along the second direction, and the third opening exposes a portion of the first sacrificial layer between neighboring first stack structures;
a step of forming the second support layer comprises: using the first mask layer as a mask, and etching the first sacrificial layer exposed by the second opening and the first semiconductor layer facing the second opening to form a second hole; and forming the second support layer fully occupying the second hole; and
a step of forming the third support layer comprises: using the first mask layer as a mask, and etching the first sacrificial layer exposed by the third opening and the first semiconductor layer facing the third opening to form a third hole; and forming the third support layer fully occupying the third hole.

15. The manufacturing method according to claim 14, wherein steps of forming the transistor structure comprise:
using the second semiconductor layer and the support structure as masks, and removing the remaining parts of the first semiconductor layer and the first sacrificial layer to form a fourth hole;
forming a second sacrificial layer fully occupying the fourth hole;
forming a second mask layer, wherein the second mask layer is located on the third region of the semiconductor channel;
using the second mask layer as a mask, removing the second sacrificial layer in contact with the first region of the semiconductor channel, and removing the second sacrificial layer in contact with the second stack structure; and
forming a gate structure and a conducting layer, wherein the gate structure covers a side wall of the first region of the semiconductor channel, the conducting layer covers a side wall of the second semiconductor layer in the second stack structure, the transistor structure comprises the gate structure and the first region, and the conducting layer and the second semiconductor layer in the second stack structure form an initial wordline staircase structure.

16. The manufacturing method according to claim 15, wherein along the third direction, there is a second gap between gate structures covering side walls of different first regions, there is a third gap between conducting layers covering side walls of first semiconductor layers in different second stack structures, and the manufacturing method further comprises:
forming a first dielectric layer, wherein the first dielectric layer fully occupies the second gap and the third gap.

17. The manufacturing method according to claim 15, wherein steps of forming the capacitor structure comprise:
forming a third mask layer comprising a fourth opening, wherein the fourth opening is located on the third region of the semiconductor channel;
using the third mask layer as a mask, and removing the second sacrificial layer in contact with the third region to form a fifth hole;
forming a sub bottom electrode layer, wherein the sub bottom electrode layer covers a side wall of the semiconductor channel exposed by the fifth hole;
forming a capacitor dielectric layer, wherein the capacitor dielectric layer covers a side wall of the sub bottom electrode layer away from the semiconductor channel; and
forming a top electrode layer, wherein the top electrode layer fully occupies the fifth hole, wherein
the semiconductor channel of the third region and the sub bottom electrode layer form a bottom electrode layer; and the bottom electrode layer, the capacitor dielectric layer, and the top electrode layer form the capacitor structure.

18. The manufacturing method according to claim 15, wherein a step of forming the wordline staircase structure comprises: partially etching the initial wordline staircase structure and the first semiconductor layer in the second stack structure for a plurality of times to form the wordline staircase structure, wherein the wordline staircase structure comprises a plurality of step structures disposed along the third direction, and lengths of the plurality of step structures along the first direction are different.

19. The manufacturing method according to claim 18, further comprising:
forming a plurality of first conducting columns extending along the third direction, wherein the first conducting columns are in a one-to-one correspondence with the step structures, and the first conducting columns are in contact with and connected to the step structures; and
forming a plurality of second conducting columns extending along the third direction, wherein the second conducting columns are in contact with and connected to the capacitor structure.

* * * * *